United States Patent
Ando et al.

(10) Patent No.: US 11,847,289 B2
(45) Date of Patent: Dec. 19, 2023

(54) PRESSING FORCE DETECTION DEVICE

(71) Applicant: Murata Manufacturing Co., Ltd., Nagaokakyo (JP)

(72) Inventors: Masamichi Ando, Nagaokakyo (JP); Takashi Kihara, Nagaokakyo (JP); Hidekazu Kano, Nagaokakyo (JP); Yuuki Tachibana, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/816,551

(22) Filed: Aug. 1, 2022

(65) Prior Publication Data

US 2022/0365630 A1     Nov. 17, 2022

Related U.S. Application Data

(63) Continuation of application No. PCT/JP2021/024750, filed on Jun. 30, 2021.

(30) Foreign Application Priority Data

Jul. 10, 2020  (JP) ................................. 2020-118888

(51) Int. Cl.
  *G06F 3/044*     (2006.01)
  *G06F 3/041*     (2006.01)
  *G01L 1/16*      (2006.01)

(52) U.S. Cl.
  CPC .............. *G06F 3/0447* (2019.05); *G01L 1/16* (2013.01); *G06F 3/0414* (2013.01); *G06F 2203/04105* (2013.01)

(58) Field of Classification Search
  CPC .................. G06F 3/0447; G06F 3/0414; G06F 2203/04105; G01L 1/16
  See application file for complete search history.

(56) References Cited

U.S. PATENT DOCUMENTS 7,997,144 B1      8/2011   Pekarek et al.
2013/0338963 A1*  12/2013  Murata ................... G06F 3/016
                                                        702/142

(Continued)

FOREIGN PATENT DOCUMENTS

JP       2016080551 A    5/2016
JP       201733505 A     2/2017

(Continued)

OTHER PUBLICATIONS

International Search Report in PCT/JP2021/024750, dated Sep. 7, 2021, 3 pages.

*Primary Examiner* — Afroza Chowdhury
(74) *Attorney, Agent, or Firm* — ArentFox Schiff LLP (57) ABSTRACT

A pressing sensor is provided that generates an output voltage of a first polarity by deforming with an operation plate when a part of a user's body touches the operation plate, and generates the output voltage of a second polarity by deforming with the operation plate when the part of the user's body is moved away from the operation plate. Moreover, a calculation unit calculates an electrical parameter integral value by time-integrating an electrical parameter that changes with the output voltage generated by the pressing sensor. The electrical parameter has a third polarity when the output voltage has the first polarity and has a fourth polarity when the output voltage has the second polarity. The calculation unit calculates a subtraction electrical parameter integral value obtained by subtracting a predetermined value having the third polarity per unit time from the electrical parameter integral value.

20 Claims, 9 Drawing Sheets

(56) References Cited

U.S. PATENT DOCUMENTS

| | | | |
|---|---|---|---|
| 2014/0331791 A1 | 11/2014 | Ishii et al. | |
| 2017/0052074 A1 | 2/2017 | Watazu et al. | |
| 2019/0227649 A1* | 7/2019 | Micci | G06F 3/016 |
| 2019/0341541 A1 | 11/2019 | Yoshida et al. | |
| 2019/0377468 A1 | 12/2019 | Micci et al. | |
| 2019/0377469 A1* | 12/2019 | Routley | G06F 3/0446 |
| 2021/0202822 A1* | 7/2021 | Lin | H10N 30/802 |

FOREIGN PATENT DOCUMENTS

| | | | |
|---|---|---|---|
| JP | 2019220166 A | 12/2019 | |
| WO | 2013111841 A1 | 8/2013 | |
| WO | 2018096924 A1 | 5/2018 | |

\* cited by examiner

PRESSING FORCE DETECTION DEVICE

CROSS REFERENCE TO RELATED APPLICATIONS

This application is a continuation of PCT Application No. PCT/JP2021/024750, filed Jun. 30, 2021, which claims priority to Japanese Patent Application No. 2020-118888, filed Jul. 10, 2020, the entire contents of each of which are hereby incorporated in their entirety.

TECHNICAL FIELD

The present invention relates to a pressing force detection device.

BACKGROUND

A conventional pressing force detection device such as a touch input device, for example, is described in Japanese Patent Application Laid-Open No. 2017-33505 (hereinafter "Patent Document 1"). This touch input device includes an operation plate, a piezoelectric film, and a control unit. The piezoelectric film is attached to the operation plate. Moreover, the piezoelectric film outputs an output voltage when the operation plate is pressed by a user. The control unit determines whether a difference between the output voltage and a reference voltage exceeds a threshold. Then, the control unit integrates the difference between the output voltage and the reference voltage in a section where the difference between the output voltage and the reference voltage exceeds the threshold.

In operation, the piezoelectric film generates an output voltage when deformation of the piezoelectric film progresses. Therefore, unless the deformation of the piezoelectric film progresses, the piezoelectric film does not generate an output voltage even if the user keeps pressing the operation plate. Accordingly, the touch input device described in Patent Document 1 uses an integral value of the difference between the output voltage and the reference voltage. This enables the touch input device to detect that the user keeps pressing the operation plate and that the user stops pressing the operation plate.

In the touch input device described in Patent Document 1, a drift occurs in the integral value of the difference between the output voltage and the reference voltage due to, for example, a noise generated in an output signal. When a drift occurs in the integral value of the difference between the output voltage and the reference voltage, the integral value of the difference between the output voltage and the reference voltage keeps increasing. In some cases, the integral value of the difference between the output voltage and the reference voltage does not become 0 when the user stops pressing the operation plate. As a result, the touch input device may erroneously detect that the user is still pressing the operation plate.

SUMMARY OF THE INVENTION

Accordingly, it is an object of the present invention to provide a pressing force detection device configured to appropriately detect a pressing state of a part of a user's body or a member operated by the user against an operation plate.

In an exemplary aspect, a pressing force detection device includes an operation plate that a part of a user's body or a member operated by the user touches; a pressing sensor provided on the operation plate, the pressing sensor generating an output voltage of a first polarity by deforming with the operation plate when the part of the user's body or the member operated by the user touches the operation plate, the pressing sensor generating the output voltage of a second polarity opposite to the first polarity by deforming with the operation plate when the part of the user's body or the member operated by the user is moved away from the operation plate; and a calculation unit. Moreover, in the exemplary aspect, the electrical parameter changes with the output voltage generated by the pressing sensor, the electrical parameter has a third polarity when the output voltage has the first polarity, the electrical parameter has a fourth polarity opposite to the third polarity when the output voltage has the second polarity, and the calculation unit calculates a subtraction electrical parameter integral value by subtracting a predetermined value having the third polarity per unit time from an electrical parameter integral value obtained by time-integrating the electrical parameter.

In another exemplary aspect, a pressing force detection device is provided that includes an operation plate that a part of a user's body or a member operated by the user touches; a pressing sensor provided on the operation plate, the pressing sensor generating an output voltage of a first polarity by deforming with the operation plate when the part of the user's body or the member operated by the user touches the operation plate, the pressing sensor generating the output voltage of a second polarity opposite to the first polarity by deforming with the operation plate when the part of the user's body or the member operated by the user is moved away from the operation plate; and a calculation unit. In this aspect, an electrical parameter changes with the output voltage generated by the pressing sensor, the electrical parameter has a third polarity when the output voltage has the first polarity, the electrical parameter has a fourth polarity opposite to the third polarity when the output voltage has the second polarity, a first threshold is a value having the third polarity, a second threshold is a value having the fourth polarity, an absolute value of the second threshold is smaller than an absolute value of the first threshold or is 0, and the calculation unit calculates an electrical parameter integral value by time-integrating the electrical parameter when a value obtained by subtracting the first threshold from the electrical parameter having the third polarity has the third polarity and by time-integrating the electrical parameter when a value obtained by subtracting the second threshold from the electrical parameter having the fourth polarity has the fourth polarity.

According to the exemplary aspects, a pressing force detection device is provided that is configured to detect a pressing state of a part of a user's body or a member operated by the user against an operation plate.

DETAILED DESCRIPTION

First Exemplary Embodiment

Figure 1:
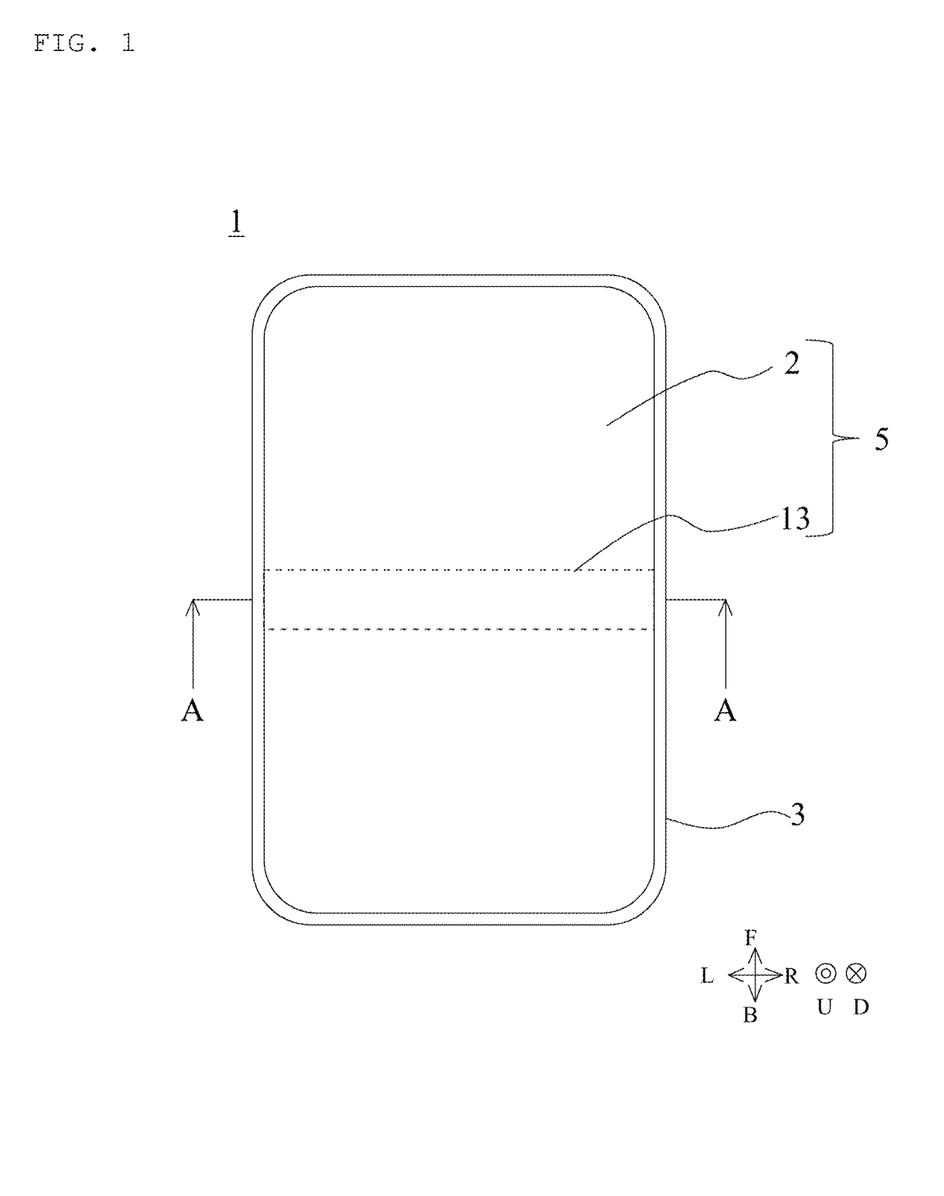
FIG. 1 is a top view of electronic equipment 1.
Figure 2:
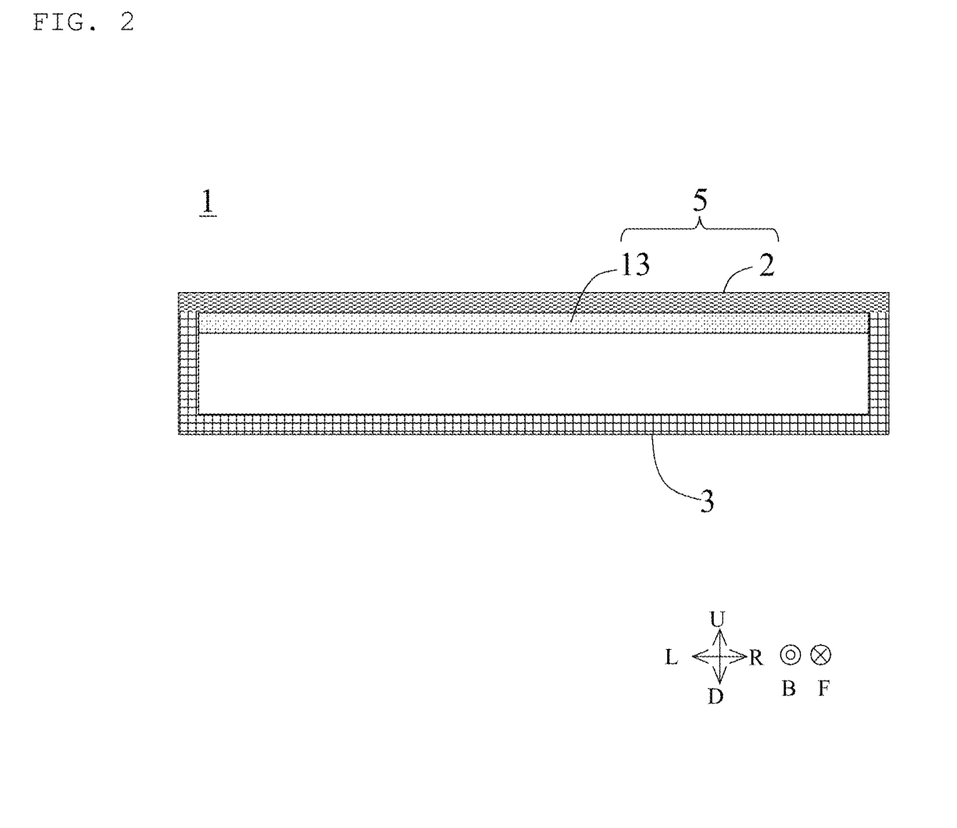
FIG. 2 is a sectional view of the electronic equipment 1 taken along the line A-A.
Figure 3:
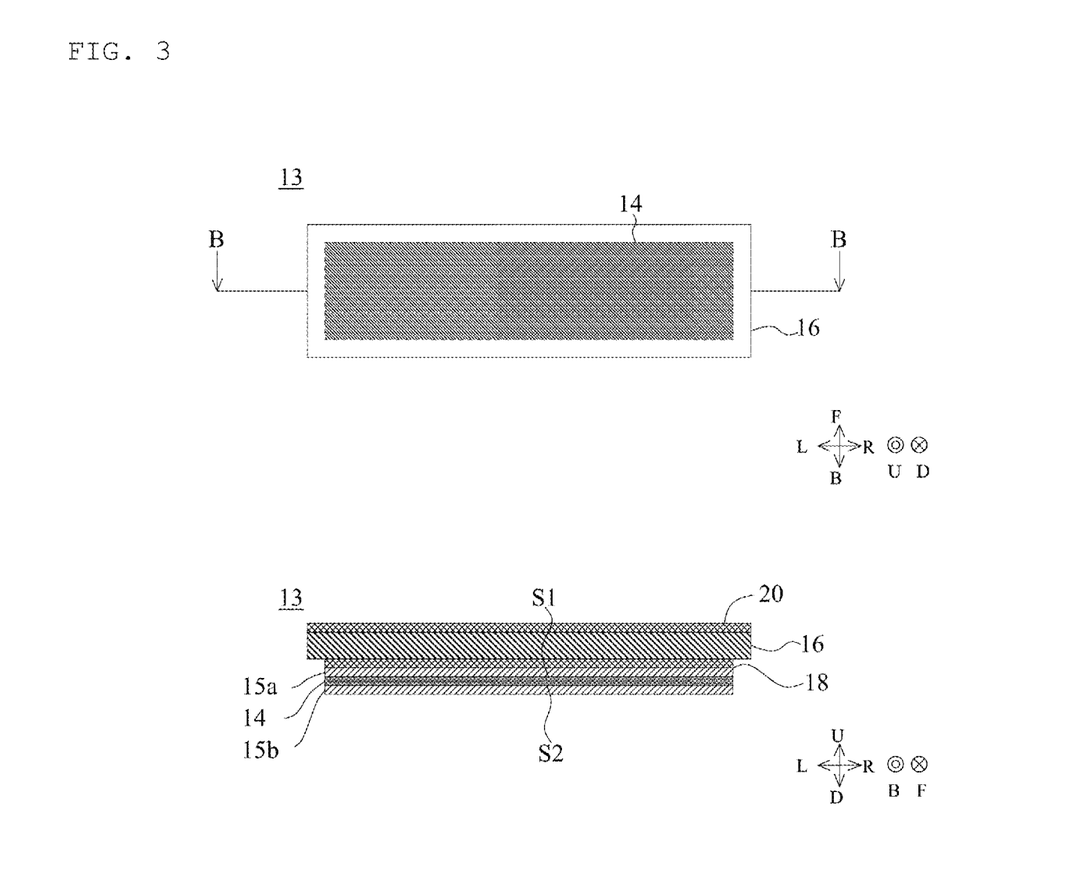
FIG. 3 is a bottom view of a pressing sensor 13 and a sectional view taken along the line B-B.
Figure 4:
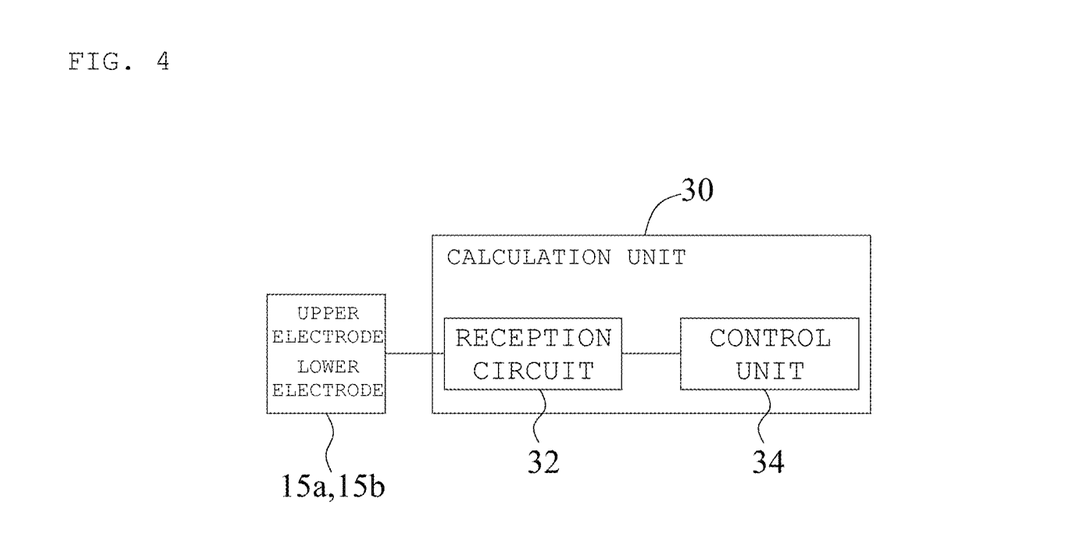
FIG. 4 is a block diagram of the pressing sensor 13.

Hereinafter, configurations of a pressing sensor 13 according to a first exemplary embodiment and electronic equipment 1 will be described with reference to the drawings. FIG. 1 is a top view of the electronic equipment 1. FIG. 2 is a sectional view of the electronic equipment 1 taken along the line A-A. FIG. 3 is a bottom view of the pressing sensor 13 and a sectional view taken along the line B-B. FIG. 4 is a block diagram of the pressing sensor 13.

In the present disclosure, relative directions are defined as follows. In the pressing sensor 13, a normal direction of a piezoelectric body 14 is defined as an up-down direction. A direction in which a long side of the piezoelectric body 14 extends is defined as a left-right direction. A direction in which a short side of the piezoelectric body 14 extends is defined as a front-back direction. In general, the up-down direction, the left-right direction, and the front-back direction are orthogonal to each other. It is also noted that the definition of the directions in the present disclosure is an example. Therefore, the directions at the time of actual use of the pressing sensor 13 do not need to coincide with the directions in the present disclosure. For example, the up-down direction may be reversed in FIG. 1. Similarly, the left-right direction may be reversed in FIG. 1 and the front-back direction may be reversed in FIG. 1.

In an exemplary aspect, the electronic equipment 1 is a portable electronic terminal, such as a smartphone or a tablet computer. As illustrated in FIGS. 1 and 2, the electronic equipment 1 includes a housing 3 and a pressing force detection device 5. The housing 3 is a box. The housing 3 has a rectangular shape as viewed in the up-down direction. The upper face of the housing 3 is open. The opening of the housing 3 has a rectangular shape as viewed in the up-down direction.

The pressing force detection device 5 is configured to detect a pressing force applied to the operation plate 2 when a part of a user's body (for example, a finger) or a member operated by the user (for example, a pen) touches the operation plate 2. Hereinafter, a case where a user's finger touches the operation plate 2 will be described. The pressing force detection device 5 includes the operation plate 2, the pressing sensor 13, and a calculation unit 30, as shown in FIG. 4.

The operation plate 2 can be a transparent plate and has an upper main face and a lower main face. The operation plate 2 has a rectangular shape as viewed in the up-down direction. The operation plate 2 closes the opening of the housing 3. The operation plate 2 and the housing 3 form a space therein. In this space, a battery, a circuit board, a central processing unit (CPU), and the like (not illustrated) are provided. The operation plate 2 may include, for example, a display. A user's finger (e.g., a part of the user's body or a member operated by the user) touches the operation plate 2. Moreover, the operation plate 2 can be an opaque plate when the user does not need to transparently view the display or the like under the operation plate 2 through the operation plate 2.

The pressing sensor 13 is provided on the operation plate 2. As illustrated in FIG. 2, the pressing sensor 13 is fixed to the lower main face of the operation plate 2. The pressing sensor 13 has a rectangular shape having long sides extending in the left-right direction as viewed in the up-down direction. The pressing sensor 13 extends in the left-right direction at the center of the operation plate 2 in the up-down direction. In the present embodiment, an example in which the pressing sensor 13 is attached to the center of the operation plate 2 in the up-down direction is shown, but the attachment position of the pressing sensor 13 is not limited to this position. A plurality of pressing sensors 13 may be provided in an alternative aspect.

When the user's finger (e.g., a part of the user's body or a member operated by the user) touches the operation plate 2, the pressing sensor 13 deforms with the operation plate 2, thereby generating an output voltage of a first polarity (e.g., positive). When the user's finger (e.g., a part of the user's body or a member operated by the user) is moved away from the operation plate 2, the pressing sensor 13 deforms with the operation plate 2, thereby generating an output voltage of a second polarity (e.g., negative) opposite to the first polarity (e.g., positive). Hereinafter, details of the pressing sensor 13 will be described with reference to FIG. 3.

As illustrated in FIG. 3, the pressing sensor 13 includes the piezoelectric body 14, an upper electrode 15a, a lower electrode 15b, a substrate 16, and adhesive layers 18 and 20. As illustrated in FIG. 3, the piezoelectric body 14 has a film shape. Therefore, the piezoelectric body 14 has an upper main face S1 and a lower main face S2. The length of the piezoelectric body 14 in the left-right direction is longer than the length of the piezoelectric body 14 in the front-back direction in an exemplary aspect. Moreover, in the present embodiment, the piezoelectric body 14 has a rectangular shape having long sides extending in the left-right direction as viewed in the up-down direction. The piezoelectric body 14 is configured to generate an output voltage corresponding to a deformation amount of the piezoelectric body 14. The material of the piezoelectric body 14 is, for example, polylactic acid. Hereinafter, the piezoelectric body 14 will be described in more detail.

In the exemplary aspect, the piezoelectric body 14 is configured to have a property that the polarity of the output voltage generated when the piezoelectric body 14 stretches in the left-right direction is opposite to the polarity of the output voltage generated when the piezoelectric body 14 stretches in the front-back direction. Specifically, the piezoelectric body 14 is a film formed of a chiral polymer in an exemplary aspect. More particularly, the chiral polymer is, for example, polylactic acid (PLA), in particular, poly-L-lactic acid (PLLA). The main chain of PLLA made of a chiral polymer has a helical structure. PLLA has piezoelectricity in which molecules are oriented when uniaxially stretched. The piezoelectric body 14 has a piezoelectric constant of $d_{14}$. The uniaxial stretching direction (i.e., the orientation direction) of the piezoelectric body 14 forms an angle of 45 degrees with respect to each of the front-back direction and the left-right direction. The 45 degrees include, for example, an angle including about 45 degrees±10 degrees. This causes the piezoelectric body 14 to generate an output voltage when the piezoelectric body 14 stretches in the left-right direction or stretches in the front-back direction. The piezoelectric body 14 generates an output voltage of the first polarity (e.g., positive) when stretching in the left-right direction for example. The piezoelectric body 14 generates an output voltage of the second polarity (e.g., negative) when stretching in the front-back direction for example. The magnitude of the output voltage depends on a value obtained by time-differentiating a deformation amount of the piezoelectric body 14 due to stretch.

In the exemplary aspect, the upper electrode 15a is a signal electrode and n output voltage is output from the upper electrode 15a. As illustrated in FIG. 3, the upper electrode 15a is provided on the upper main face S1. Moreover, the upper electrode 15a covers substantially the whole upper main face S1. The lower electrode 15b is a ground electrode that is connected to a ground potential. As illustrated in FIG. 3, the lower electrode 15b is provided on the lower main face S2. Therefore, the piezoelectric body 14 is positioned (e.g., sandwiched) between the upper electrode 15a and the lower electrode 15b. The lower electrode 15b covers substantially the whole lower main face S2. The upper electrode 15a and the lower electrode 15b are, for example, an inorganic electrode such as indium tin oxide (ITO) or zinc oxide (ZnO), an organic electrode such as PeDOT or conductive polyaniline, a metal film by vapor deposition or plating, or a printed electrode film with a silver paste.

The substrate 16 is provided on the upper electrode 15a and deforms with the piezoelectric body 14 because it holds the piezoelectric body 14, the upper electrode 15a, and the lower electrode 15b. In the exemplary aspect, the substrate 16 has a sheet shape with an upper main face and a lower main face. The length of the substrate 16 in the left-right direction is longer than the length of the substrate 16 in the front-back direction. In the present embodiment, the substrate 16 has a rectangular shape having long sides extending in the left-right direction as viewed in the up-down direction. The material of the substrate 16 is, for example, polyethylene terephthalate (PET) or polyurethane. It is noted that the substrate 16 is not an essential component, and is a member used according to design. A protective film (not shown) of the same material may be provided on the lower face of the lower electrode 15b to protect the lower electrode 15b in an exemplary aspect.

As further illustrated in FIG. 3, the adhesive layer 18 fixes the piezoelectric body 14 and the upper electrode 15a to the lower main face of the substrate 16. This configuration causes the deformation of the substrate 16 to transmit to the piezoelectric body 14.

Moreover, the adhesive layer 20 is provided on the upper main face of the substrate 16. The adhesive layer 20 fixes the substrate 16 to the lower main face of the operation plate 2. The adhesive layers 18, 20 are, for example, acrylic, rubber-based, silicon-based, and urethane-based pressure-sensitive adhesives. It should be appreciated that the adhesive layers 18 and 20 are selected according to an adherend and required adhesive strength.

When a user's finger touches the upper main face of the operation plate 2, a downward pressing force is applied to the operation plate 2. In this case, the operation plate 2 deforms in such a manner as to protrude downward. Since the pressing sensor 13 is fixed to the lower main face of the operation plate 2, the pressing sensor 13 deforms in such a manner as to protrude downward with the operation plate 2. At this time, the pressing sensor 13 stretches in the left-right direction. As a result, the pressing sensor 13 generates an output voltage of the first polarity (e.g., positive). The output voltage of the first polarity (e.g., positive) is output from the upper electrode 15a and the lower electrode 15b.

When the user's finger is moved away from the operation plate 2, the downward pressing force applied to the operation plate 2 is released. In this case, the operation plate 2 deforms in such a manner as to return to a flat plate shape. Since the pressing sensor 13 is fixed to the lower main face of the operation plate 2, the pressing sensor 13 deforms in such a manner as to return to a flat plate shape with the operation plate 2. At this time, the pressing sensor 13 contracts in the left-right direction. That is, the pressing sensor 13 stretches in the front-back direction. This configuration causes the pressing sensor 13 to generate an output voltage of the second polarity (e.g., negative). The output voltage of the second polarity (e.g., negative) is output from the upper electrode 15a and the lower electrode 15b.

Moreover, the calculation unit 30 is configured to calculate an electrical parameter integral value by time-integrating an electrical parameter that changes with the output voltage generated by the pressing sensor 13. More specifically as shown in FIG. 4, the calculation unit 30 includes a reception circuit 32 and a control unit 34. When a downward pressing force is applied to the operation plate 2, the pressing sensor 13 generates an output voltage of the first polarity (e.g., positive). The reception circuit 32 supplies electric charges to the pressing sensor 13 so as to neutralize the output voltage. When the downward pressing force to the operation plate 2 is released, the pressing sensor 13 generates an output voltage of the second polarity (e.g., negative). The reception circuit 32 supplies electric charges to the pressing sensor 13 so as to neutralize the output voltage. In this manner, the electrical parameter that changes with the output voltage generated by the pressing sensor 13 is a value of the current flowing from the reception circuit 32 to the pressing sensor 13. The electrical parameter has a third polarity (e.g., positive) when the output voltage has the first polarity (e.g., positive). The electrical parameter has a fourth polarity (e.g., negative) opposite to the third polarity (e.g., positive) when the output voltage has the second polarity (e.g., negative).

The control unit 34 is configured to calculate an electric charge amount (e.g., an electrical parameter integral value) by time-integrating the value (e.g., an electrical parameter) of the current flowing from the reception circuit 32 to the pressing sensor 13. The control unit 34 is, for example, a central processing unit (CPU). Therefore, the control unit 34 calculates the electrical parameter integral value by software processing. This allows the control unit 34 to calculate the pressing force exerted on the operation plate 2 by the user's finger based on the electrical parameter integral value.

Moreover, the control unit 34 is configured to calculate the electrical parameter integral value by time-integrating the electrical parameter regardless of the magnitude of the absolute value of the electrical parameter. That is, in the pressing force detection device 5 according to the present embodiment, thresholds Th1 and Th2 as described later are not provided. Therefore, the control unit 34 calculates the electrical parameter integral value by time-integrating the electrical parameter in all the periods.

Figure 5:
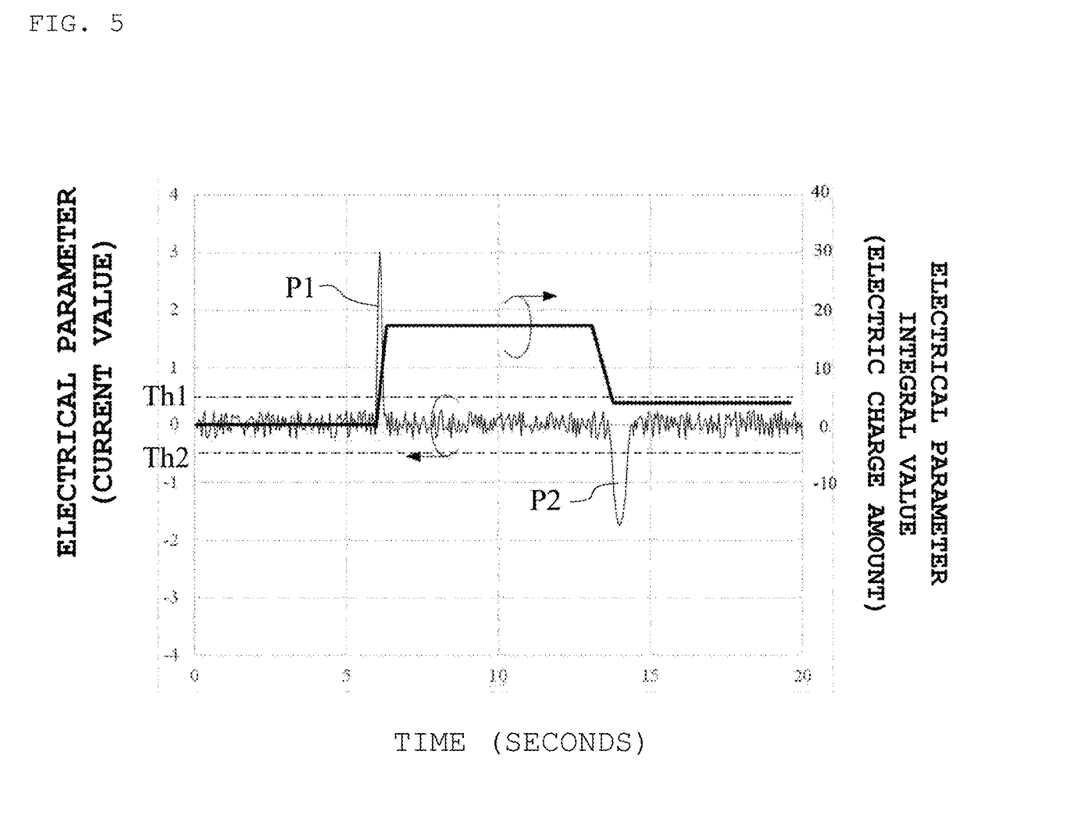
FIG. 5 is a graph illustrating a relationship between time and an electrical parameter and a relationship between time and an electrical parameter integral value.
Figure 6:
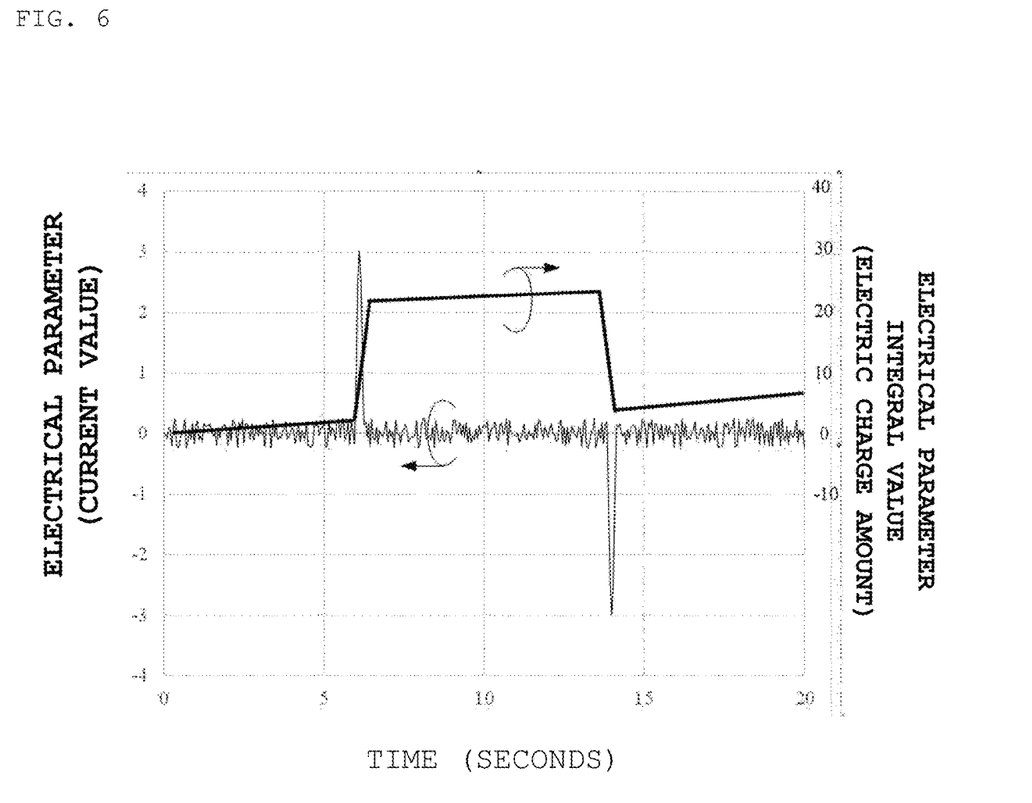
FIG. 6 is a graph illustrating a relationship between time and an electrical parameter and a relationship between time and an electrical parameter integral value.

Hereinafter, an operation of the control unit 34 will be described. First, erroneous detection occurring in the pressing force detection devices according to Comparative Examples 1 and 2 will be described. FIGS. 5 and 6 are graphs illustrating a relationship between time and an electrical parameter and a relationship between time and an electrical parameter integral value. More particularly, FIG. 5 illustrates an example in which a drift caused by the way of touch with the user's finger occurs in the electrical parameter integral value. FIG. 6 illustrates an example in which a drift caused by a noise occurs in the electrical parameter integral value. The horizontal axis of FIGS. 5 and 6 represents time (i.e., in seconds). The vertical axis of FIGS. 5 and 6 represents a current value or an integral value of an electrical parameter.

In the pressing force detection device according to Comparative Example 1, thresholds Th1 and Th2 are provided. The threshold Th1 has a value of the third polarity (e.g., positive). The threshold Th2 has a value of the fourth polarity (e.g., negative). The absolute value of the threshold Th1 is equal to the absolute value of the threshold Th2. When the electrical parameter becomes equal to or more than the threshold Th1, the pressing force detection device according to Comparative Example 1 calculates the electrical parameter integral value by time-integrating the electrical parameter. When the electrical parameter becomes equal to or less than the threshold Th2, the pressing force detection device according to Comparative Example 1 calculates the electrical parameter integral value by time-integrating the electrical parameter. In this manner, the pressing force detection device according to Comparative Example 1 is provided with the thresholds Th1 and Th2, thereby reducing the influence of a noise generated in the electrical parameter (or the output voltage) on the electrical parameter integral value.

However, depending on the way of touch with the user's finger, a drift occurs in the electrical parameter integral value. More specifically, in FIG. 5, the user strongly presses the operation plate 2 downward with a finger, thereafter the user keeps touching the operation plate 2 with the finger and then slowly moves the finger away from the operation plate 2. When the user strongly presses the operation plate 2 downward with the finger, the waveform of the electrical parameter rises sharply. When the user slowly moves the finger away from the operation plate 2, the waveform of the electrical parameter rises gently.

Here, the pressing force detection device according to Comparative Example 1 calculates the electrical parameter integral value when the electrical parameter becomes equal to or more than the threshold Th1. The pressing force detection device according to Comparative Example 1 calculates the electrical parameter integral value when the electrical parameter becomes equal to or less than the threshold Th2. In this case, an electrical parameter integral value P2 in a period in which the electrical parameter is equal to or less than the threshold Th2 when the user slowly moves the finger away from the operation plate 2 is smaller than an electrical parameter integral value P1 in a period in which the electrical parameter is equal to or more than the threshold Th1 when the user strongly presses the operation plate 2 downward with the finger. Therefore, the electrical parameter integral value does not return to 0 after the user moves the finger away from the operation plate 2. Then, when the user repeats such an operation, the electrical parameter integral value keeps increasing. That is, a drift occurs in the electrical parameter integral value since the electrical parameter integral value has not returned to 0. Such a drift occurring in the electrical parameter integral value causes erroneous detection of the pressing force detection device according to Comparative Example 1.

In the pressing force detection device according to Comparative Example 2, a drift may occur in the electrical parameter integral value, for example due to a noise flowing into the reception circuit. Specifically, the noise may include a third polarity (e.g., positive) component more than a fourth polarity (e.g., negative) component. In addition, the pressing force detection device according to Comparative Example 2 is not provided with the thresholds Th1, Th2. Therefore, the pressing force detection device according to Comparative Example 2 calculates the electrical parameter integral value by time-integrating the electrical parameter including a noise. As a result, the electrical parameter integral value keeps increasing over time based on this calculation that includes noise. That is, a drift occurs in the electrical parameter integral value. Such a drift occurring in the electrical parameter integral value causes erroneous detection of the pressing force detection device according to Comparative Example 2.

Figure 7:
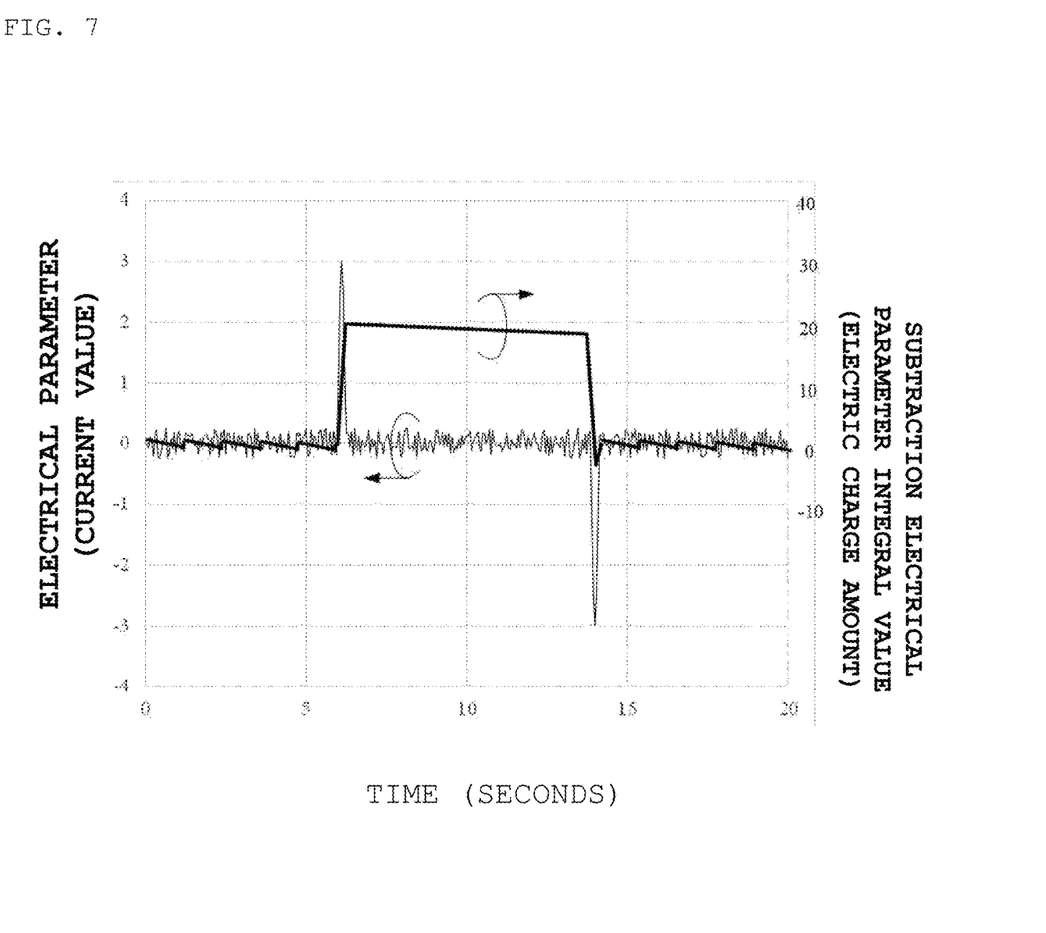
FIG. 7 is a graph illustrating a relationship between time and an electrical parameter and a relationship between time and a subtraction electrical parameter integral value.

Accordingly, the pressing force detection device 5 performs an operation described below. According to the exemplary aspect, FIG. 7 is a graph illustrating a relationship between time and an electrical parameter and a relationship between time and a subtraction electrical parameter integral value. The horizontal axis of FIG. 7 represents time (i.e., in seconds). The vertical axis of FIG. 7 represents an electrical parameter or an integral value.

In the pressing force detection device 5 according to the present embodiment, the calculation unit 30 calculates a subtraction electrical parameter integral value by subtracting a predetermined value having the third polarity (e.g., positive) per unit time from the electrical parameter integral value obtained by time-integrating the electrical parameter. This inhibits the subtraction electrical parameter integral value from keeping increasing. As a result, occurrence of a drift in the subtraction electric parameter integral value is inhibited. Further, when the subtraction electrical parameter integral value has the fourth polarity (e.g., negative), the calculation unit 30 sets the subtraction electrical parameter integral value to 0. As a result, the waveform of the subtraction electrical parameter integral value has a sawtooth shape in a period in which the user does not press the operation plate 2 with a finger. That is, the subtraction electrical parameter integral value is inhibited from keeping decreasing over time.

Figure 8:
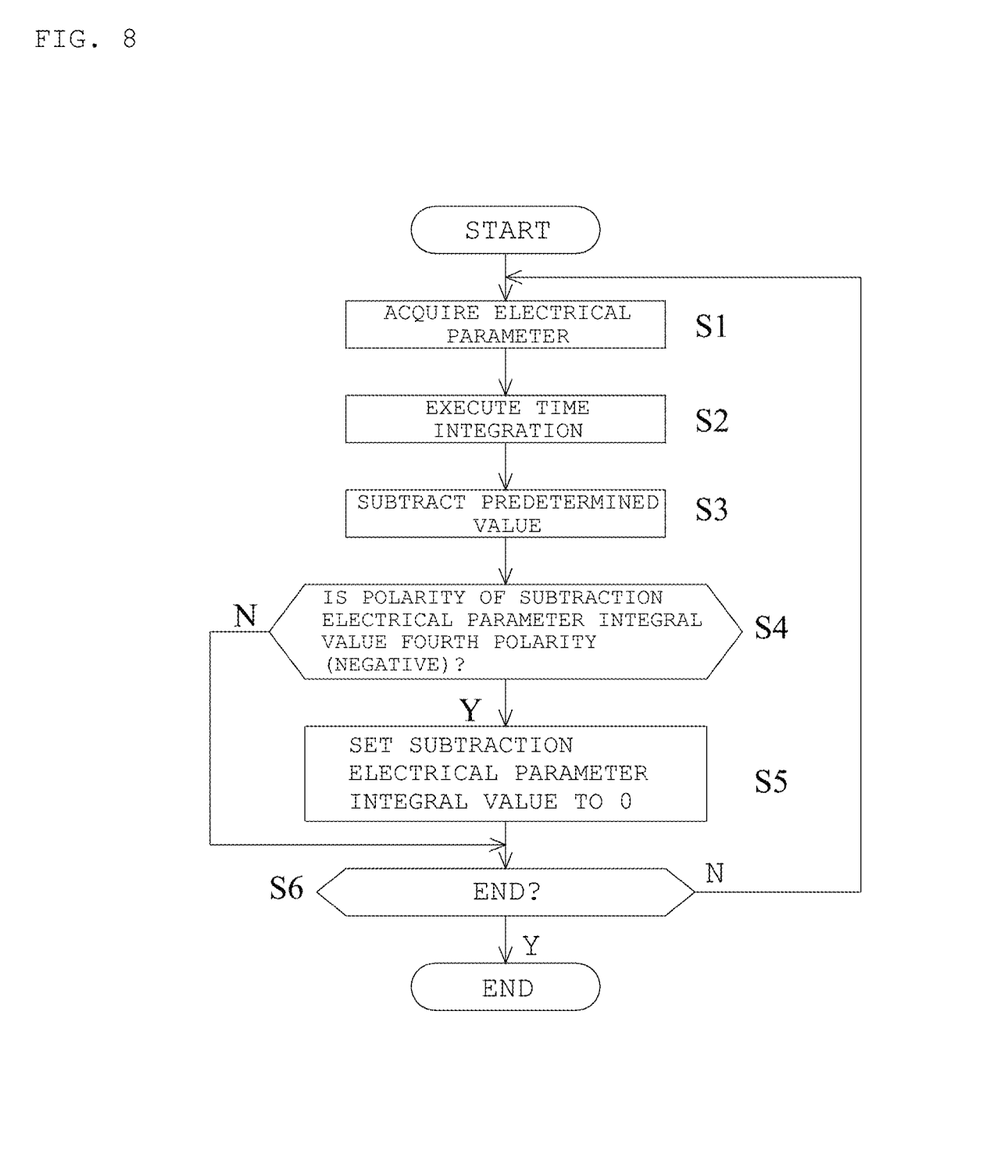
FIG. 8 is a flowchart executed by a control unit 34.

Next, an operation executed by the control unit 34 of the pressing force detection device 5 will be described with reference to the drawings. FIG. 8 is a flowchart executed by the control unit 34.

This processing starts when the control unit 34 acquires an electrical parameter from the reception circuit (step S1). Next, the control unit 34 time-integrates the electrical parameter (step S2). As a result, the control unit 34 acquires an electrical parameter integral value.

Next, the control unit 34 subtracts a predetermined value from the electrical parameter integral value (step S3). In the present embodiment, as described above, the control unit 34 subtracts 0.05 levels per second from the electrical parameter integral value. As such, the control unit 34 subtracts a value obtained by dividing 0.05 levels by the time required between steps S1 to S6 from the electrical parameter integral value as the predetermined value. As a result, the control unit 34 acquires the subtraction electrical parameter integral value.

Next, the control unit 34 determines whether the subtraction electrical parameter integral value has the fourth polarity (e.g., negative). When the subtraction electrical parameter integral value has the fourth polarity (e.g., negative), the processing proceeds to step S5. When the subtraction electrical parameter integral value does not have the fourth polarity (e.g., negative), the processing proceeds to step S6.

When the subtraction electrical parameter integral value has the fourth polarity (e.g., negative), the control unit 34 sets the subtraction electrical parameter integral value to 0 (step S5). Thereafter, the processing proceeds to step S6.

In step S6, the control unit 34 determines whether to end the processing. When the processing is not ended, the processing returns to step S1.

While executing steps S1 to S6, the control unit 34 determines whether the operation plate 2 is pressed by the user based on the subtraction electrical parameter integral value. Specifically, when the subtraction electrical parameter integral value is equal to or more than a threshold, the control unit 34 determines that the operation plate 2 is pressed by the user. When the subtraction electrical parameter integral value is not equal to or more than the threshold, the control unit 34 determines that the operation plate 2 is not pressed by the user.

Technical Effects

The pressing force detection device 5 is configured to appropriately detect a pressing state of a part of a user's body or a member operated by the user against the operation plate 2. More specifically, the calculation unit 30 calculates the subtraction electrical parameter integral value by subtracting a predetermined value having the third polarity (e.g., positive) per unit time from the electrical parameter integral value. This inhibits the subtraction electrical parameter integral value from keeping increasing when a drift occurs in the electrical parameter integral value. As a result, after the user moves a part of the user's body or a member operated by the user away from the operation plate 2, the subtraction electrical parameter integral value becomes 0. As a result, the pressing force detection device 5 is configured to detect that the user has moved a part of the user's body or a member operated by the user away from the operation plate 2. In this manner, the pressing force detection device 5 can appropriately detect a pressing state of a part of the user's body or a member operated by the user against the operation plate 2. As a result, it is not necessary to provide an output voltage detection circuit or use a touch panel together to appropriately detect a pressing state of a part of the user's body or a member operated by the user against the operation plate 2.

As illustrated in FIG. 7, in a period in which a part of the user's body or a member operated by the user keeps touching the operation plate 2, the subtraction electrical parameter integral value decreases without a change of the pressing force. However, when a part of the user's body or a member operated by the user keeps touching the operation plate 2, the user feels tired and tends to decrease the pressing force unconsciously. Therefore, in a period in which a part of the user's body or a member operated by the user keeps touching the operation plate 2, the user is less likely to have a feeling of strangeness with the pressing force not changing or the subtraction electrical parameter integral value decreasing.

In the pressing force detection device 5, when the subtraction electrical parameter integral value has the fourth polarity (e.g., negative), the calculation unit 30 sets the subtraction electrical parameter integral value to 0. As a result, the waveform of the subtraction electrical parameter integral value has a sawtooth shape in a period in which the user does not press the operation plate 2 with a part of the user's body or a member operated by the user. That is, the subtraction electrical parameter integral value is inhibited from continuing to decrease over time.

In the pressing force detection device 5, the calculation unit 30 calculates the subtraction electrical parameter integral value by subtracting a predetermined value having the third polarity (e.g., positive) per unit time from the electrical parameter integral value. This configures the pressing force detection device 5 to accurately detect the pressing state of a part of the user's body or a member operated by the user against the operation plate 2. Therefore, it is not necessary to consider the influence of a noise on the electrical parameter, and therefore the threshold Th1 and Th2 are not necessary in the pressing force detection device 5. As a result, the calculation unit 30 is configured to calculate the electrical parameter integral value by time-integrating the electrical parameter regardless of the magnitude of the absolute value of the electrical parameter.

In the pressing force detection device 5, the pressing sensor 13 includes the piezoelectric body 14 including polylactic acid as a material. Since polylactic acid does not have pyroelectricity, a drift of the electrical parameter integral value caused by temperature hardly occurs. In addition, polylactic acid has high transparency. Therefore, when the operation plate 2 is a touch panel, the pressing sensor 13 can be prevented from impairing the transparency of the operation plate 2. When the operation plate 2 is a capacitive touch panel, the touch panel and the pressing sensor 13 can be formed as one sensor element by using polylactic acid as a material of the piezoelectric body 14.

Second Exemplary Embodiment

Figure 9:
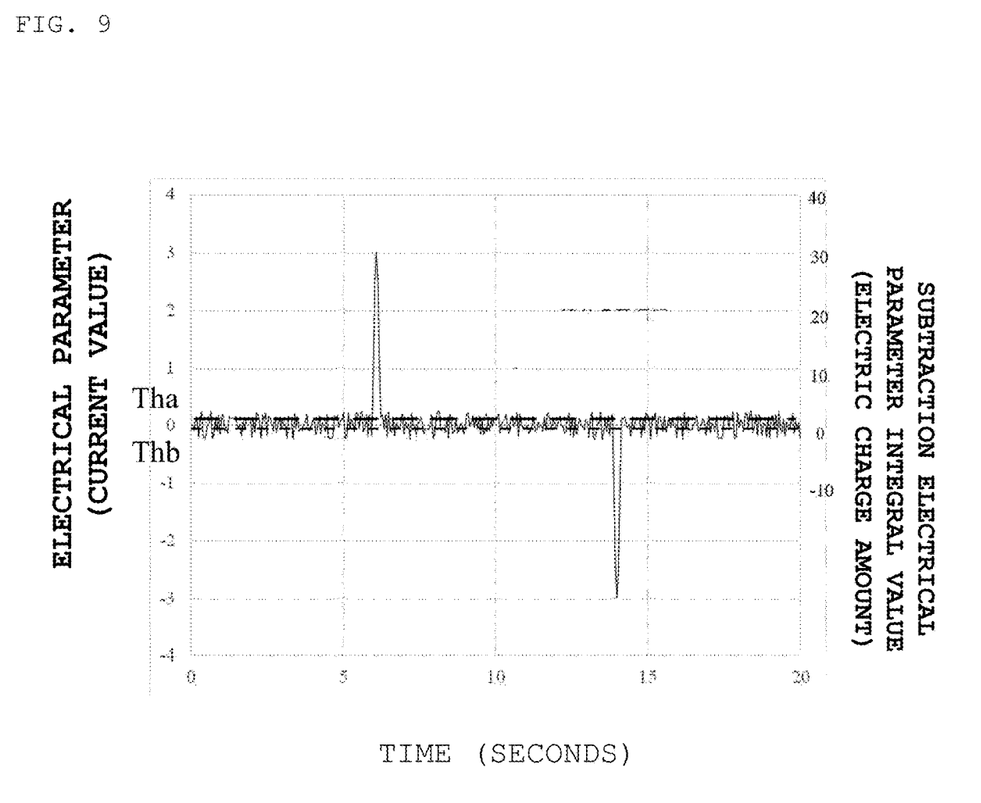
FIG. 9 is a graph illustrating a relationship between time and an electrical parameter and a relationship between time and a subtraction electrical parameter integral value.

Hereinafter, configurations of a pressing force detection device 5a according to a second exemplary embodiment and the electronic equipment 1 will be described with reference to the drawings. The pressing force detection device 5a is different from the pressing force detection device 5 in the operation of the calculation unit 30. Therefore, the pressing force detection device 5a will be described focusing on this difference. Description of the same configuration as that of the pressing force detection device 5 in the pressing force detection device 5a will be omitted. FIG. 9 is a graph illustrating a relationship between time and an electrical parameter and a relationship between time and a subtraction electrical parameter integral value. The horizontal axis of FIG. 9 represents time (i.e., seconds). The vertical axis of FIG. 9 represents an electrical parameter or an integral value.

First, a first threshold Tha and a second threshold Thb are defined as follows. The first threshold Tha is a value having the third polarity (e.g., a positive threshold). The second threshold Thb is a value having the fourth polarity (e.g., a negative threshold). The absolute value of the second threshold Thb is smaller than the absolute value of the first threshold Tha. The second threshold Thb may be 0 in one exemplary aspect.

The calculation unit 30 is configured to calculate the electrical parameter integral value by time-integrating the electrical parameter when the value obtained by subtracting the first threshold Tha from the electrical parameter having the third polarity has the third polarity and by time-integrating the electrical parameter when the value obtained by subtracting the second threshold Thb from the electrical parameter having the fourth polarity has the fourth polarity. More specifically, when the electrical parameter having the third polarity (e.g., a positive polarity) is larger than the first threshold Tha, the calculation unit 30 calculates the electrical parameter integral value obtained by time-integrating the electrical parameter. On the other hand, when the electrical parameter having the third polarity is equal to or less than the first threshold Tha, the calculation unit 30 does not calculate the electrical parameter integral value obtained by time-integrating the electrical parameter. When the electrical parameter having the fourth polarity (e.g., a negative polarity) is smaller than the second threshold Thb, the calculation unit 30 calculates the electrical parameter integral value obtained by time-integrating the electrical parameter. When the electrical parameter having the fourth polarity is equal to or more than the second threshold Thb, the calculation unit 30 does not calculate the electrical parameter integral value obtained by time-integrating the electrical parameter.

Figure 10:
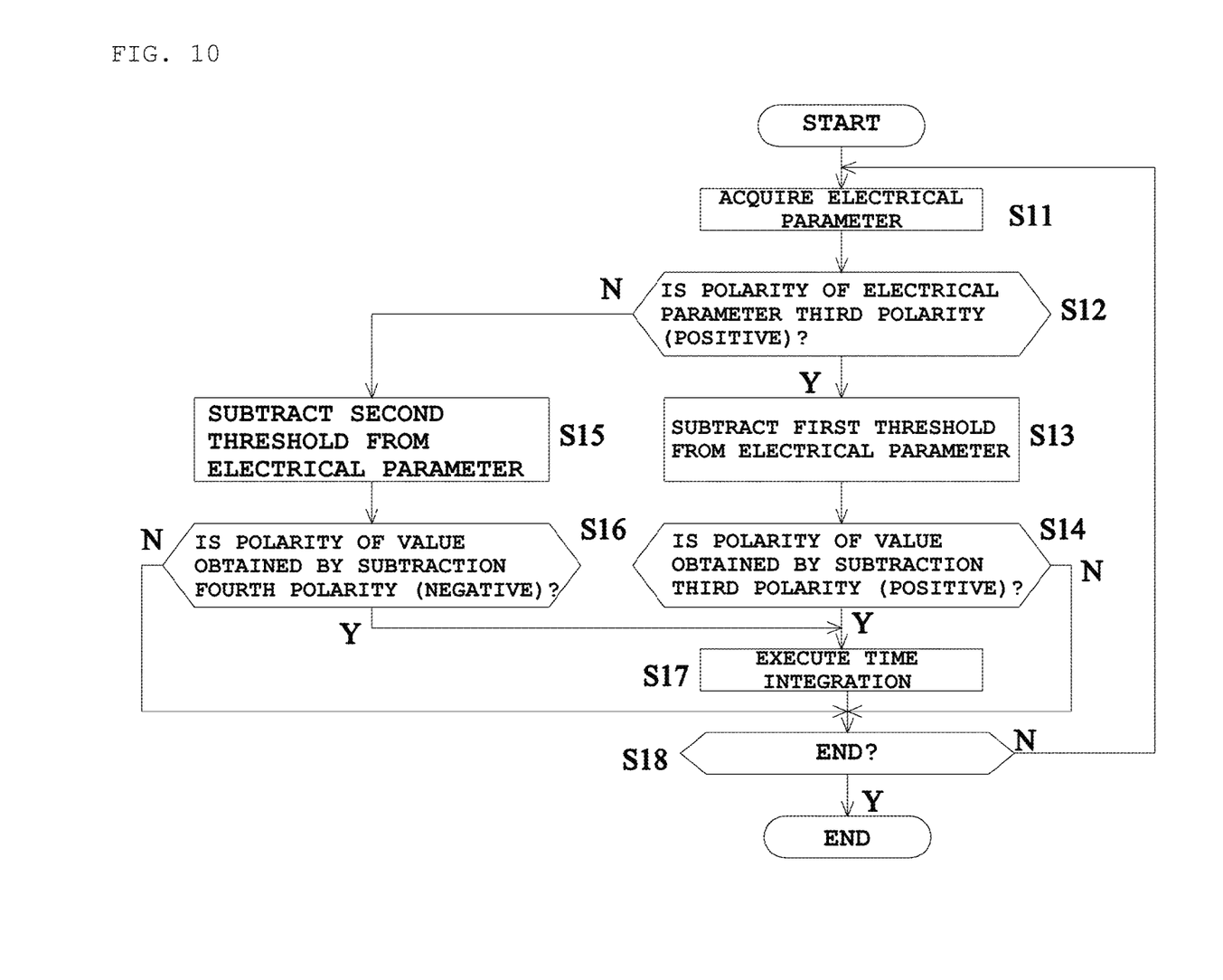
FIG. 10 is a flowchart executed by the control unit 34.

Next, an operation executed by the control unit 34 of the pressing force detection device 5a will be described with reference to the drawings. FIG. 10 is a flowchart executed by the control unit 34.

This processing starts when the control unit 34 acquires an electrical parameter from the reception circuit (step S11). Next, the control unit 34 determines whether the electrical parameter has the third polarity (e.g., positive) (step S12). When the electrical parameter has the third polarity (e.g., positive), the processing proceeds to step S13. When the electrical parameter does not have the third polarity (e.g., positive), the processing proceeds to step S15.

When the electrical parameter has the third polarity (e.g., positive), the control unit 34 subtracts the first threshold Tha from the electrical parameter (step S13). Further, the control unit 34 determines whether the value obtained by subtracting the first threshold Tha from the electrical parameter in step S13 has the third polarity (e.g., positive). In step S13, the control unit 34 determines whether the electrical parameter exceeds the first threshold Tha. When the value obtained by subtracting the first threshold Tha from the electrical parameter has the third polarity (e.g., positive), the processing proceeds to step S17. When the value obtained by subtracting the first threshold Tha from the electrical parameter does not have the third polarity (e.g., positive), the processing proceeds to step S18.

When the electrical parameter does not have the third polarity (e.g., positive), the control unit 34 subtracts the second threshold Thb from the electrical parameter (step S15). Further, the control unit 34 determines whether the value obtained by subtracting the second threshold Thb from the electrical parameter in step S15 has the fourth polarity (e.g., negative). In step S15, the control unit 34 determines whether the electrical parameter exceeds the second threshold Thb. When the value obtained by subtracting the second threshold Thb from the electrical parameter has the fourth polarity (e.g., negative), the processing proceeds to step S17. When the value obtained by subtracting the second threshold Thb from the electrical parameter does not have the fourth polarity (e.g., negative), the processing proceeds to step S18.

In step S17, the control unit 34 time-integrates the electrical parameter. As a result, the control unit 34 acquires an electrical parameter integral value. Thereafter, the processing proceeds to step S18.

In step S18, the control unit 34 determines whether to end the processing. When the processing is not ended, the processing returns to step S11.

While executing steps S11 to S18, the control unit 34 is configured to determine whether the operation plate 2 is pressed by the user based on the electrical parameter integral value. Specifically, when the electrical parameter integral value is equal to or more than the threshold, the control unit 34 determines that the operation plate 2 is pressed by the user. When the electrical parameter integral value is not equal to or more than a threshold, the control unit 34 determines that the operation plate 2 is not pressed by the user.

Technical Effects

The pressing force detection device 5a can appropriately detect a pressing state of a part of the user's body or a member operated by the user against the operation plate 2. More specifically, the first threshold Tha is a value having the third polarity (e.g., a positive polarity). The second threshold Thb is a value having the fourth polarity (e.g., a negative polarity). The absolute value of the second threshold Thb is smaller than the absolute value of the first threshold Tha. The calculation unit 30 calculates the electrical parameter integral value by time-integrating the electrical parameter when the value obtained by subtracting the first threshold Tha from the electrical parameter having the third polarity has the third polarity and by time-integrating the electrical parameter when the value obtained by subtracting the second threshold Thb from the electrical parameter having the fourth polarity has the fourth polarity. As a result, the period during which the calculation unit 30 performs the time integration in a case where the electrical parameter has the third polarity tends to be shorter than the period during which the calculation unit 30 performs the time integration in a case where the electrical parameter has the fourth polarity. In other words, the electrical parameter integral value includes the electrical parameter of the fourth polarity more than the electrical parameter of the third polarity. This configuration inhibits the electrical parameter integral value from continuing to increase. As a result, after the user moves a part of the user's body or a member operated by the user away from the operation plate 2, the subtraction electrical parameter integral value becomes 0. Therefore, the pressing force detection device 5a can detect that the user has moved a part of the user's body or a member operated by the user away from the operation plate 2. In this manner, the pressing force detection device 5a can appropriately detect the pressing state of a part of the user's body or a member operated by the user against the operation plate 2.

Additional Exemplary Embodiments

The pressing force detection device according to the present invention is not limited to the pressing force detection devices 5, 5a, as described above, and can be modified within the scope of the gist thereof. In addition, the configurations of the pressing force detection devices 5, 5a may be freely combined in alternative aspects.

In the pressing force detection devices 5, 5a, the first polarity is positive, and the second polarity is negative. However, these polarities are exemplary and it should be appreciated that the first polarity can be negative, and the second polarity can be positive in an alternative aspect.

Similarly, in the pressing force detection devices 5, 5a, the third polarity is positive, and the fourth polarity is negative. However, these polarities are exemplary and it should be appreciated that the third polarity can be negative, and the fourth polarity can be positive in an alternative aspect.

In the pressing force detection devices 5, 5a, the electrical parameter may be a current value or a voltage value. However, it is noted that the electrical parameter may be any value that changes with the output voltage of the pressing sensor 13. Therefore, the electrical parameter may be the output voltage itself.

In the pressing force detection device 5, the calculation unit 30 may change the magnitude of the predetermined value having the third polarity according to the magnitude of the electrical parameter integral value. For example, when the electrical parameter integral value is relatively large, the calculation unit 30 relatively increases the absolute value of the predetermined value having the third polarity. When the electrical parameter integral value is relatively small, the calculation unit 30 relatively decreases the absolute value of the predetermined value having the third polarity. This configuration inhibits a drift of the electrical parameter integral value while inhibiting the decrease in sensitivity of the pressing sensor 13 when the electrical parameter integral value is small because of a small output voltage.

In the pressing force detection devices 5 and 5*a*, the pressing sensor 13 may include the piezoelectric body 14 including polyvinylidene fluoride as a material in an exemplary aspect. This material improves the output property of the pressing sensor 13.

In the pressing force detection devices 5, 5*a*, when the pressing sensor 13 includes the piezoelectric body 14 including polyvinylidene fluoride as a material, an output voltage of the second polarity (e.g., a negative polarity) may be generated due to a pyroelectric effect. This configuration reduces the influence of the drift caused by a temperature rise of the piezoelectric body 14. More specifically, when the material of the piezoelectric body 14 has pyroelectricity, the piezoelectric constant of the piezoelectric body 14 increases. Therefore, the S/N of the output voltage of the piezoelectric body 14 increases. As a result, the output property of the pressing sensor 13 improves. However, when the material of the piezoelectric body 14 has pyroelectricity, a drift is likely to occur in the electrical parameter integral value due to a temperature rise of the piezoelectric body 14. As such, the pressing sensor 13 can be configured to generate an output voltage of the second polarity due to the pyroelectric effect. This configuration inhibits the electrical parameter integral value from keeping increasing.

In the pressing force detection devices 5, 5*a*, the operation of the control unit 34 is realized by software processing. However, an electric circuit can be provided to perform an operation equivalent to the operation of the control unit 34 as would be appreciated to one skilled in the art.

In the pressing force detection device 5, the calculation unit 30 calculates the subtraction electrical parameter integral value by subtracting a predetermined value having the third polarity (e.g., a positive polarity) per unit time from the electrical parameter integral value obtained by time-integrating the electrical parameter. The calculation unit 30 may perform this processing by adding white noise to the electrical parameter. The white noise contains a fourth polarity (e.g., negative) component more than a third polarity (e.g., positive) component. In this case, the thresholds (e.g., the thresholds Th1, Th2, the first threshold Tha, the second threshold Thb, etc.) as described above do not have to be provided. If all the electrical parameters are integrated without a threshold, the value of the fourth polarity included in a larger amount in the white noise is always integrated. As a result, the electrical parameter always behaves to swing to the negative side. Since the electrical parameter smaller than 0 is always corrected to 0, an increase in the electrical parameter due to a drift is inhibited. Since a threshold is not provided, when the user slowly pushes with a finger or the user slowly moves the finger away, a drift caused by the threshold is inhibited.

In the pressing force detection device 5, the calculation unit 30 calculates the subtraction electrical parameter integral value by subtracting a predetermined value having the third polarity (e.g., positive) per unit time from the electrical parameter integral value obtained by time-integrating the electrical parameter. The calculation unit 30 may perform this processing by subtracting the value having the third polarity (e.g., positive) from the electrical parameter. As a result, it can be considered that 0 of the electrical parameter is offset to the third polarity (e.g., positive).

DESCRIPTION OF REFERENCE SYMBOLS

1: Electronic equipment
2: Operation plate
3: Housing
5, 5*a*: Pressing force detection device
13: pressing sensor
14: Piezoelectric body
15*a*: Upper electrode
15*b*: Lower electrode
16: Substrate
18, 20: Adhesive layer
30: Calculation unit
32: Reception circuit
34: Control unit

The invention claimed is:

1. A pressing force detection device comprising:
an operation plate configured to receive a touch input from a user or a member operated by the user;
a pressing sensor coupled to the operation plate and configured to generate an output voltage of a first polarity by deforming with the operation plate in response to the touch input received by the operation plate, the pressing sensor further configured to generate the output voltage of a second polarity opposite to the first polarity by deforming with the operation plate in response to the touch input being moved away from the operation plate; and
a calculation unit,
wherein an electrical parameter changes with the output voltage generated by the pressing sensor,
wherein the electrical parameter has a third polarity when the output voltage has the first polarity and a fourth polarity that is opposite to the third polarity when the output voltage has the second polarity, and
wherein the calculation unit is configured to calculate a subtraction electrical parameter integral value by subtracting a predetermined value having the third polarity per unit time from an electrical parameter integral value obtained by time-integrating the electrical parameter.

2. The pressing force detection device according to claim 1, wherein the calculation unit is configured to set the subtraction electrical parameter integral value to 0 when the subtraction electrical parameter integral value has the fourth polarity.

3. The pressing force detection device according to claim 1, wherein the calculation unit is configured to calculate the electrical parameter integral value by time-integrating the electrical parameter regardless of a magnitude of an absolute value of the electrical parameter.

4. The pressing force detection device according to claim 1, wherein the calculation unit is configured to change a magnitude of the predetermined value having the third polarity according to a magnitude of the electrical parameter integral value.

5. The pressing force detection device according to claim 1, wherein the pressing sensor includes a piezoelectric body including polylactic acid.

6. The pressing force detection device according to claim 1, wherein the pressing sensor includes a piezoelectric body including polyvinylidene fluoride.

7. The pressing force detection device according to claim 1, wherein the pressing sensor is configured to generate the output voltage of the second polarity due to a pyroelectric effect.

8. The pressing force detection device according to claim 1, wherein the first polarity and the third polarity comprise a positive polarity and the second polarity and the fourth polarity comprise a negative polarity.

9. The pressing force detection device according to claim 1, wherein the calculation unit comprises a central processing unit configured to execute software stored on a memory for calculating the subtraction electrical parameter integral value.

10. The pressing force detection device according to claim 1,
wherein the pressing sensor comprises a piezoelectric body, a pair of electrodes disposed on opposing surfaces of the piezoelectric body, and a substrate coupled to one electrode of the pair of electrodes, and
wherein the substrate is coupled to the operation plate by an adhesive layer.

11. A pressing force detection device comprising:
an operation plate configured to receive a touch input from a user or a member operated by the user;
a pressing sensor coupled to the operation plate and configured to generate an output voltage of a first polarity by deforming with the operation plate in response to the touch input received by the operation plate, the pressing sensor further configured to generate the output voltage of a second polarity opposite to the first polarity by deforming with the operation plate in response to the touch input being moved away from the operation plate; and
a calculation unit,
wherein an electrical parameter changes with the output voltage generated by the pressing sensor,
wherein the electrical parameter has a third polarity when the output voltage has the first polarity and the electrical parameter has a fourth polarity that is opposite to the third polarity when the output voltage has the second polarity,
wherein a first threshold is a value having the third polarity, a second threshold is a value having the fourth polarity, and an absolute value of the second threshold is smaller than an absolute value of the first threshold or is 0, and
wherein the calculation unit is configured to calculate an electrical parameter integral value by time-integrating the electrical parameter when a value obtained by subtracting the first threshold from the electrical parameter having the third polarity has the third polarity and by time-integrating the electrical parameter when a value obtained by subtracting the second threshold from the electrical parameter having the fourth polarity has the fourth polarity.

12. The pressing force detection device according to claim 11, wherein the pressing sensor includes a piezoelectric body including polylactic acid.

13. The pressing force detection device according to claim 11, wherein the pressing sensor includes a piezoelectric body including polyvinylidene fluoride.

14. The pressing force detection device according to claim 11, wherein the pressing sensor is further configured to generate the output voltage of the second polarity due to a pyroelectric effect.

15. The pressing force detection device according to claim 11, wherein the first polarity and the third polarity comprise a positive polarity and the second polarity and the fourth polarity comprise a negative polarity.

16. The pressing force detection device according to claim 11, wherein the calculation unit comprises a central processing unit configured to execute software stored on a memory for calculating the electrical parameter integral value.

17. The pressing force detection device according to claim 11,
wherein the pressing sensor comprises a piezoelectric body, a pair of electrodes disposed on opposing surfaces of the piezoelectric body, and a substrate coupled to one electrode of the pair of electrodes, and
wherein the substrate is coupled to the operation plate by and adhesive layer.

18. A method for detecting a pressing force, the method comprising:
receiving, by an operation plate, a touch input from a user or a member operated by the user;
generating, by a pressing sensor coupled to the operation plate, an output voltage of a first polarity by deforming with the operation plate in response to the touch input received by the operation plate;
generating, by the pressing sensor, the output voltage of a second polarity opposite to the first polarity by deforming with the operation plate in response to the touch input being moved away from the operation plate; and
changing an electrical parameter with the output voltage generated by the pressing sensor,
wherein the electrical parameter has a third polarity when the output voltage has the first polarity and a fourth polarity that is opposite to the third polarity when the output voltage has the second polarity, and
wherein the method further comprises calculating a subtraction electrical parameter integral value by subtracting a predetermined value having the third polarity per unit time from an electrical parameter integral value obtained by time-integrating the electrical parameter.

19. The method according to claim 18, further comprising setting the subtraction electrical parameter integral value to 0 when the subtraction electrical parameter integral value has the fourth polarity.

20. The method according to claim 18, further comprising calculating the electrical parameter integral value by time-integrating the electrical parameter regardless of a magnitude of an absolute value of the electrical parameter.

* * * * *